(12) United States Patent
Gouthez et al.

(10) Patent No.: US 10,905,006 B2
(45) Date of Patent: Jan. 26, 2021

(54) TEXTILE ELECTRONIC DEVICE FOR SMART CLOTHING

(71) Applicant: BIOSERENITY, Paris (FR)

(72) Inventors: Marion Gouthez, Paris (FR); Marc Frouin, Paris (FR)

(73) Assignee: BIOSERENITY, Paris (FR)

( * ) Notice: Subject to any disclaimer, the term of this patent is extended or adjusted under 35 U.S.C. 154(b) by 0 days.

(21) Appl. No.: 16/348,595

(22) PCT Filed: Nov. 10, 2017

(86) PCT No.: PCT/FR2017/053072
§ 371 (c)(1),
(2) Date: May 9, 2019

(87) PCT Pub. No.: WO2018/087489
PCT Pub. Date: May 17, 2018

(65) Prior Publication Data
US 2019/0373724 A1    Dec. 5, 2019

(30) Foreign Application Priority Data

Nov. 10, 2016 (FR) ..................... 16 60936
Nov. 9, 2017 (TW) ..................... 106139076 A

(51) Int. Cl.
*H05K 1/03* (2006.01)
*H05K 1/18* (2006.01)
(Continued)

(52) U.S. Cl.
CPC ............ *H05K 1/038* (2013.01); *B32B 25/20* (2013.01); *B32B 27/40* (2013.01); *D02G 3/441* (2013.01);
(Continued)

(58) Field of Classification Search
CPC .. H05K 1/038; H05K 1/189; H05K 2201/083; B32B 25/20; B32B 27/40; D02G 3/441; H01R 13/6205
See application file for complete search history.

(56) References Cited

U.S. PATENT DOCUMENTS 5,898,992 A * 5/1999 Annable ............. B23K 1/0016
29/840
9,338,915 B1    5/2016 Liu et al.
(Continued)

FOREIGN PATENT DOCUMENTS

DE    20 2009 005706 A1    7/2009

OTHER PUBLICATIONS

International Search Report dated Feb. 16, 2018 in corresponding International application No. PCT/FR2017/053072; 4 pages.

*Primary Examiner* — Roshn K Varghese
(74) *Attorney, Agent, or Firm* — Maier & Maier, PLLC

(57) ABSTRACT

A textile electronic device configured to be connected to a conductive zone of a textile, the device including: an electronic circuit; at least a first mechanical and electrical connection means configured to be connected to the conductive zone of a textile; a textile substrate having at least a second electrical connection means, the at least one second electrical connection means being electrically connected to the electronic circuit and to the at least one first mechanical and electrical connection means; and a flexible envelope totally or partially including said electronic circuit, the at least one first mechanical and electrical connection means and the textile substrate, the at least one first mechanical connection means and electric being at least partially accessible through the flexible envelope. Also, a manufacturing method of the textile electronic device.

16 Claims, 4 Drawing Sheets

(51) Int. Cl.
*B32B 25/20* (2006.01)
*B32B 27/40* (2006.01)
*D02G 3/44* (2006.01)
*H01R 13/62* (2006.01)

(52) U.S. Cl.
CPC ......... *H01R 13/6205* (2013.01); *H05K 1/189* (2013.01); *H05K 2201/083* (2013.01)

(56) References Cited

U.S. PATENT DOCUMENTS

| | | | |
|---|---|---|---|
| 2004/0224138 A1 | 11/2004 | Farrell et al. | |
| 2007/0105404 A1* | 5/2007 | Lee | H01R 12/592 |
| | | | 439/37 |
| 2007/0285231 A1 | 12/2007 | Leftly et al. | |
| 2017/0125940 A1* | 5/2017 | Karagozler | H01R 13/6205 |
| 2017/0258402 A1* | 9/2017 | Acquista | H05K 1/189 |
| 2017/0325518 A1* | 11/2017 | Poupyrev | D03D 1/0088 |

* cited by examiner

TEXTILE ELECTRONIC DEVICE FOR SMART CLOTHING

FIELD OF INVENTION

The present invention relates to a textile electronic device adapted to smart clothing and a garment comprising such a device.

BACKGROUND OF INVENTION

Smart clothing and textiles require the integration of electronics on media compatible with textile constraints. To withstand these constraints, the electronic equipment must be flexible, waterproof, and must not have a thickness that is too great and which may hinder the user. The electronics must also be able to withstand all the stresses experienced by the textile or clothing in its daily use (handling, washing, drying, folding . . . ).

Smart clothing often involves shipping electronic circuits. The electronic circuits comprise a set of electronic components often interconnected by means of a printed circuit. Electronic circuit technology has been developed for many years to become a mature technology, with reasonable cost, effective quality control, and an ability to integrate a high number of components compared to other technologies such as systems. on chips (SOC). Another advantage in the use of electronic circuits is their interchangeability, for example, after the deterioration of a garment.

It is therefore necessary to find a way to connect the electronic circuit to the textile. Several alternatives exist but still have many disadvantages.

There is first of all the possibility of connecting the conductive threads of the textile to the tracks of the electronic circuit by welding in order to connect the conductive zone of the textile to the electronic circuit. This method makes it possible to limit both the size and the mass of the devices connected to the textile. However, the process of welding each component to each wire or conductive part of the textile is long and difficult to automate. In addition, this method tends to concentrate the stresses at the axis of the weld and increases the risk of breaking the conductive thread of the welded textile.

A method of installing clasps for connecting the electronic device and the textile is also known. The clasp is thus detachably connected, on one side to the textile, on the other to the electronic circuit. However, the connection is only made on one or more points; which makes the connection fragile in case of constraints on one end of the device and makes the connection unstable. In addition, the rigidity inherent in such a method and the volume occupied by the device can provide discomfort for the user and further weaken the connection.

There is also the possibility of mounting an electronic circuit directly on the textile, and sewing metal wires to the interconnection with the electronic circuit (C. Kallmayer, T. Linz, R. Aschenbrenner, and H. Reichl. System integration technologies for smart textiles. mst news, 2:42-43, 2005). This technique, however, seems difficult to achieve on an industrial scale and does not allow the replacement of the electronic circuit, or conversely, the detachment of the flexible electronic circuit to connect to another textile.

The present invention therefore aims to develop a new device comprising an electronic circuit connected to a textile, allowing an effective electrical and mechanical connection, able to withstand the stresses that the textile or clothing can be brought to undergo in its daily use. The present invention aims, at the same time, to create a computer, which is both flexible and adapted to the life cycle of a textile worn in contact with the skin of the user. The present invention also aims at providing a method of manufacturing a flexible electronic circuit adapted to smart clothing. The device according to the present invention must be able to fix and detach from the electronic textile without the implementation of complex operations or without the intervention of a technician, so that the user can perform these operations himself without difficulties. The device according to the present invention must be able to be worn by the user of the textile without any discomfort while ensuring the conventional daily use of the garment made with this textile.

SUMMARY

This invention thus relates to a textile electronic device configured to be connected to a conductive zone of a textile, said device comprising:
  an electronic circuit;
  at least a first mechanical and electrical connection means configured to be connected to the conductive zone of a textile;
  a textile substrate comprising at least a second electrical connection means, said at least one second electrical connection means being electrically connected to the electronic circuit and to the at least one first mechanical and electrical connection means; and
  a flexible envelope totally or partially including said electronic circuit, said at least one first mechanical and electrical connection means and said textile substrate, said at least one first mechanical connection means and electric being at least partially accessible through the flexible envelope.

According to one embodiment, the flexible envelope is made of polymer, preferably elastomer, polyurethane, rubber or silicone and the textile substrate is flexible.

According to one embodiment, the flexible envelope is hermetic.

According to one embodiment, the textile substrate is flexible.

According to one embodiment, said device has a flexibility for bending itself into a cylindrical piece having a radius of 5 to 10 cm without undergoing plastic deformation.

According to one embodiment, the device has a thickness of less than 5 mm.

According to one embodiment, the at least one second electrical connection means of the textile substrate comprises conductive yarns, said conductive yarns consist of a conductive material or textile yarns coated with a conductive material, preferably covered yarns with a conductive metal such as silver, or comprises a conductive ink or a conductive paint.

According to an alternative embodiment, the at least one second means of electrical connection of the textile substrate comprises a conductive ink or a conductive paint.

According to one embodiment, the at least one first mechanical and electrical connection means configured to be connected to the conductive zone of a textile is a male snap button and/or a female snap button and/or an element of a device of teeth engaged with a slider and/or a conductive magnetic connection means and/or a rivet or a combination of said means.

According to one embodiment, the device comprises at least one reinforcing piece between the electronic circuit and the textile substrate.

According to one embodiment, the electronic circuit and the at least one second electrical connection means are electrically connected by a solder material or a mechanical connection.

According to one embodiment, the textile substrate is at least partially elastic and produced either by weaving flexible textile yarns or by knitting textile yarns. Said knitting of textile threads being made with flexible or non-flexible textile yarns.

Another aspect of the present invention relates to a method of manufacturing a textile electronic device adapted to be connected to at least one conductive zone of a textile; said method comprising the following steps:
- depositing at least a second electrical connection means on a textile substrate;
- depositing an electronic circuit on the textile substrate so that at least one track of the electronic circuit is in electrical contact with the second electrical connection means;
- fixing, on the textile substrate, at least a first mechanical and electrical connection means adapted to connect to the conductive zone of a textile; said at least one first mechanical and electrical connection means being in electrical contact with the at least one second electrical connection means; and
- overmolding by a flexible envelope or the welding of two surfaces forming a flexible envelope, said flexible envelope totally or partially including said electronic circuit, said at least one first mechanical connection means and electrical and said textile substrate, said at least one first mechanical and electrical connection means being at least partially accessible through the flexible envelope.

According to one embodiment, the step of the manufacturing method of depositing an electronic circuit on the textile substrate such that at least one track of the electronic circuit is in electrical contact with the second connecting means electric comprises:
- depositing on the at least one second electrical connection means of the textile substrate with a solder material;
- depositing an electronic circuit on the textile substrate so that said solder material is in contact with the at least one second electrical connection means and the electronic circuit;
- heating said solder material to a temperature greater than the melting temperature of said solder material;
- cooling said solder material so as to electrically connect the at least one second electrical connection means of the textile substrate to the electronic circuit.

Yet another aspect of the present invention relates to a system comprising a textile electronic device according to any one of the embodiments described hereabove or obtained according to the manufacturing method of the embodiments described hereabove, and a textile comprising a conductive area and at least one means of connection configured to be detachably connected electrically and mechanically to the at least one first mechanical and electrical connection means of the device.

BRIEF DESCRIPTION OF THE DRAWINGS

FIG. 2 is a sectional view of the textile substrate 130, and the electronic circuit 140 before the electrical connection of these two elements by means of a solder material 150.

FIG. 3 is a sectional view of the textile substrate 130 and the electronic circuit 140 before the fusion of the solder material 150.

FIG. 4 illustrates an embodiment where the electrical connection is between the second electrical connection means 131 and a track of the electronic circuit 142.

FIG. 5 is a sectional view of the textile substrate 130 and the electronic circuit 140 after the electrical connection of these two elements by heating a welding material 150 or by mechanical connection.

FIG. 6 is a sectional view of the textile electronic device 100 according to an embodiment of the present invention after attachment of the electronic circuit 140 to the textile substrate 130 and after attachment to the textile substrate of at least a first mechanical and electrical connection means 120; without the flexible envelope 110.

DETAILED DESCRIPTION

Figure 1:
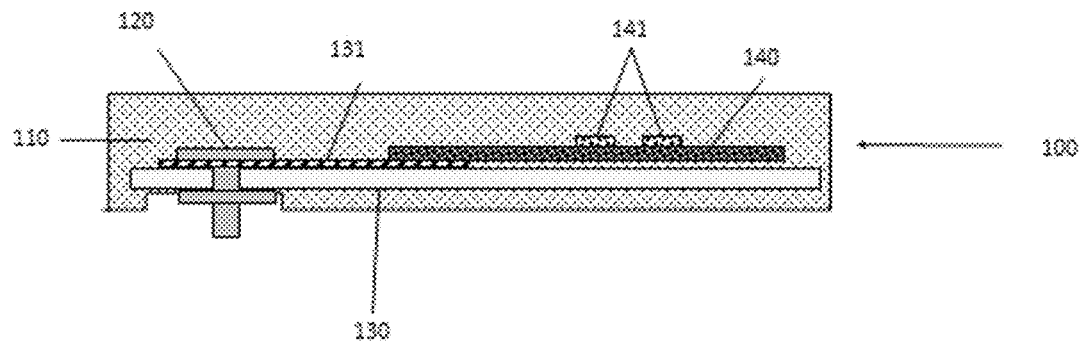
FIG. 1 is a sectional view of the textile electronic device 100 according to an embodiment of the present invention.

In the present invention, the following terms have the following meanings:
"Flexible" refers to the ability to be bent on a cylindrical piece with a radius of 5 to 10 cm without plastic deformation.
"Textile" refers to a material obtained by assembling yarns, fibers and/or filaments by any method such as, for example, weaving, or knitting.
"Smart clothing" refers to any textile capable of being worn by a subject comprising at least one conductive zone configured to transmit or receive an electrical signal.
"Mechanic connection means" refers to any means for physically connecting two parts to each other and putting them in physical or magnetic contact.

The following detailed description will be better understood when read in conjunction with the drawings. For the purpose of illustrating, the device is shown in the preferred embodiments. It should be understood, however that the application is not limited to the precise arrangements, structures, features, embodiments, and aspect shown. The drawings are not drawn to scale and are not intended to limit the scope of the claims to the embodiments depicted. Accordingly, it should be understood that where features mentioned in the appended claims are followed by reference signs, such signs are included solely for the purpose of enhancing the intelligibility of the claims and are in no way limiting on the scope of the claims.

The present invention relates to a textile electronic device capable of being connected to a conductive zone of a textile.

The device according to the present invention comprises an electronic circuit, at least a first mechanical and electrical connection means adapted to connect to the conductive zone of a textile, a textile substrate electrically connecting the electronic circuit and the at least one first means of mechanical and electrical connection, and a flexible envelope enclosing said electronic circuits, at least a first mechanical and electrical connection means, and textile substrate.

According to the present invention, the electronic circuit is a flexible or rigid electronic circuit. In one embodiment, the electronic circuit comprises a printed circuit, preferably a flexible printed circuit. A flexible electronic circuit is a technology well known to those skilled in the art, which consists of using a high-performance plastic substrate, such as polyamide.

The electronic circuit is an electrical and mechanical support for electronic components. It can be produced on a flexible support of the polyamide, polyetheretherketone (PEEK), polyester (PE) or other type. This flexible support makes it possible to fold the device or to deform it without breaking the flexible electronic circuit.

It can also be performed on a rigid support of epoxy resin type reinforced with glass fibers (FR-4), or other.

The electronic circuit is an electrical and mechanical support for electronic components.

The flexible or rigid electronic circuit, electrically connected to the textile, is capable of recording or analyzing a signal from the textile. It is also able to respond to a signal or transmit a signal.

In one embodiment, components performing electronic functions are supported by the electronic circuit. In one embodiment, these electrical components are soldered to the electronic circuit. In one embodiment, the electronic circuit comprises layers of conductive materials, preferably copper, so as to obtain a set of tracks. These tracks electrically connect different areas of the electronic circuit, either between components or between the component to input points of the electrical circuit. In one embodiment, the electronic circuit is covered with a layer of varnish or resin that protects the tracks from oxidation and possible short circuits.

In one embodiment, the electronic circuit comprises at least one connection track.

Manufacturing of rigid or flexible electronic circuits are well known by those skilled in the art and used in a wide variety of applications In one embodiment, the electronic circuit, in particular the printed circuit is flexible.

In a not shown embodiment, the textile electronic device comprises a reinforcing piece between the electronic circuit and the textile substrate so as to protect the electronic circuit. The electronic circuit and the reinforcement piece are then of a sufficiently small size that the textile electronic device gathers its flexibility properties. In one embodiment, said reinforcing piece is rigid.

In an alternative embodiment, the electronic circuit is rigid but sufficiently small in size not to compromise the flexibility of the textile electronic device according to the present invention. The size of the rigid electronic circuit is then configured so as not to compromise the flexibility of the textile electronic device according to the present invention.

In another embodiment, the electronic circuit is composed of a sequence of rigid zones separated by flexible zones so as not to compromise the flexibility of the textile electronic device according to the present invention.

The textile substrate serves as a substrate for the device according to the present invention. In one embodiment, the textile may also serve as a flexible coating.

In one embodiment, this textile substrate is a flexible textile, preferably a flexible woven or non-woven fabric.

As illustrated in FIG. 1, the textile substrate 130 comprises at least a second electrical connection means 131 and said at least one second electrical connection means 131 is electrically connected to the electronic circuit 140.

In one embodiment, the at least one second electrical connection means is a conductive wire or a conductive ink or paint. The ink or conductive paint is loaded with an electrically conductive material, having flexibility properties, allowing this ink or conductive paint to be deposited on flexible surfaces. In one embodiment, the textile substrate comprises a plurality of second connection means. In one embodiment, the at least one second electrical connection means is an interconnection track.

Figure 2:
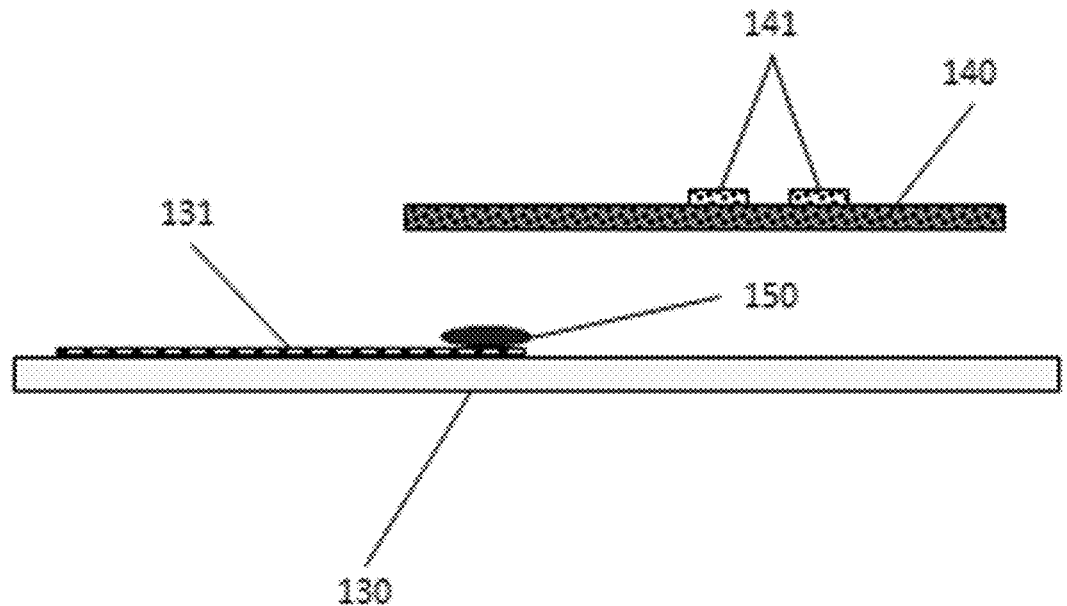
FIGS. 2 to 6 illustrate different steps of the manufacturing process of the textile electronic device 100 according to the present invention.
Figure 3:
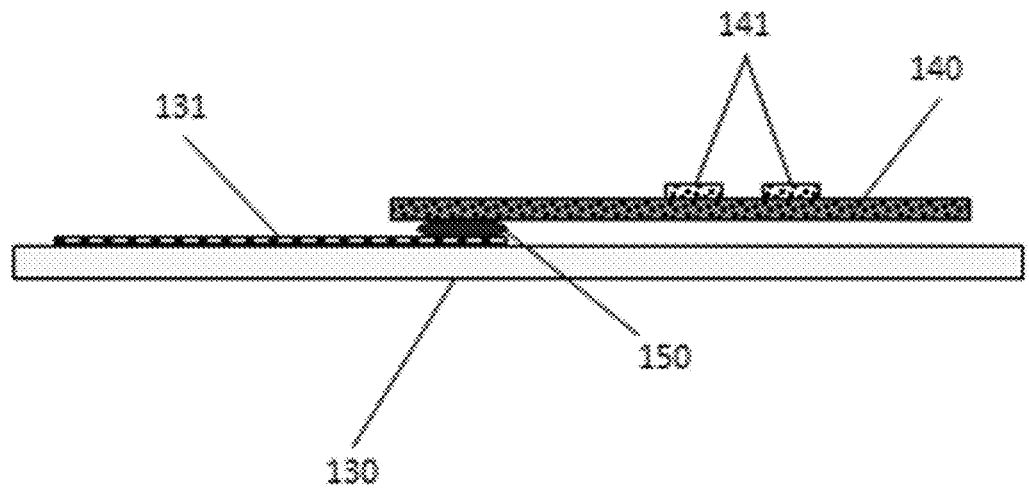

In one embodiment, illustrated in FIGS. 2 and 3, the at least one second electrical connection means 131 and the electronic circuit 140 are electrically connected by a welding material 150. In a preferred embodiment, the welding material is a soldering paste or a solder paste, which will be melted by a suitable melting process known and mastered by the skilled person. In one embodiment, illustrated in FIG. 4, the solder material 150 electrically connects the at least one second electrical connection means 131 of the textile substrate 130 to at least one connection track of the electronic circuit 142.

In a not shown embodiment, the at least one second electrical connection means of the textile substrate and the at least one connecting track of the electronic circuit are connected by a mechanical connection. In one embodiment, this mechanical connection is made by crimping. This type of connection makes it possible to avoid the use of the solder material 150 and all the process steps associated with the solder material.

The flexibility of the textile substrate allows the device according to the present invention to undergo deformation of the textile without breakage or plastic deformations. In one embodiment, the textile substrate is at least partially elastic. In one embodiment, the textile substrate is completely elastic. By elastic textile substrate is meant a textile substrate capable of undergoing stretching in two directions of at least 10% of its initial length without undergoing plastic deformation. In one embodiment, the textile substrate is capable of stretching in two directions of 15, 20, 25, 30, 40, 50, 60, 70, 80, 90, 100, 150, 200, 300 or 500 percent its initial length without undergoing plastic deformation. In the context of weaving, in 2 directions is meant the frame direction and the warp direction. In the context of knitting, by 2 directions is meant the row direction of stitches and the direction of the stitch column.

In one embodiment, the textile substrate is made by weaving flexible textile yarns. In one embodiment, flexible textile yarn means a yarn capable of undergoing longitudinal stretching of at least 10% of its initial length without undergoing plastic deformation. In one embodiment, flexible textile yarn means a yarn capable of undergoing longitudinal stretching of 15, 20, 25, 30, 40, 50, 60, 70, 80, 90, 100, 150, 200%, 300 or 500% of its initial length without undergoing plastic deformation.

In another embodiment, the textile substrate is made by knitting flexible yarns or not. The knitted structure gives the substrate its elasticity properties.

In another embodiment, the textile substrate is made by embroidery, lace, sewing or any other means known to those skilled in the art.

In one embodiment, the mechanical cohesion between the electronic circuit and the textile substrate is reinforced by other means such as glue points between these two parts, in order to limit the mechanical stresses on the electrical connection zones between the electronic circuit and the textile substrate.

The device according to the present invention comprises at least a first mechanical and electrical connection means adapted to connect to the conductive zone of a textile.

The at least one first mechanical and electrical connection means provides the electrical connection between the at least one second electrical connection means and the conductive zone of the textile.

In one embodiment, the at least one first mechanical and electrical connection means is placed at the end of the at least one second electrical connection means of the textile substrate.

The at least one first mechanical and electrical connection means also provides the mechanical connection between the device according to the present invention and the conductive zone of the textile.

Figure 7:
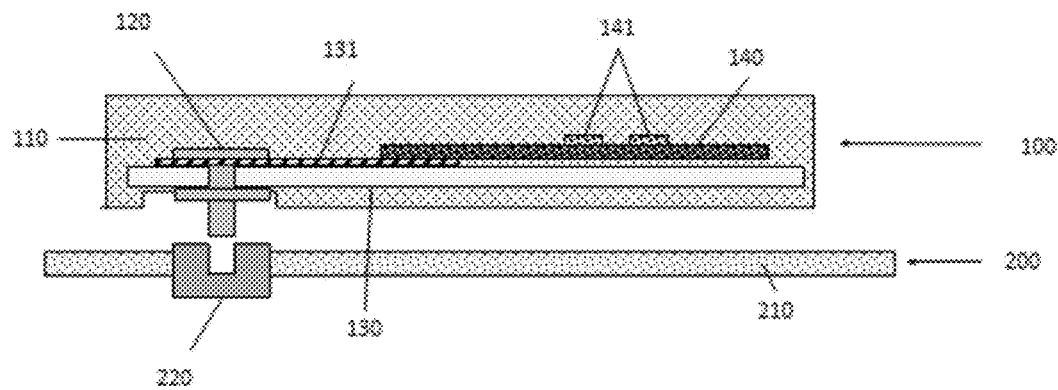
FIG. 7 is a sectional view of the system according to an embodiment of the present invention comprising a textile electronic device 100 facing a textile 200 comprising a conductive zone 210 and at least one mechanical and electrical connection means 220.

In one embodiment, represented in FIG. 7, the conductive zone of the textile 210 is comprises at least one connecting means 220 complementary to or capable of receiving the at least one first means of mechanical and electrical connection of the device 120. In one embodiment, the at least one first mechanical and electrical connection means 120 is a push button. In an alternative embodiment, the at least one first mechanical and electrical connection means 120 is an element of a device with teeth engaged with a slider (i.e. a zipper) crimped, or sewn onto the substrate textile at the end of the at least one second electrical connection means of the textile substrate 130. In another alternative embodiment, the at least one first mechanical and electrical connection means 120 is an electrically conductive magnetic connection means such as for example, an electrically conductive magnet or a ferromagnetic plate. In another embodiment, the at least one first mechanical and electrical connection means 120 is a rivet.

The flexible envelope allows to give the entire device a protective structure for the electronic circuit and the electrical components.

The flexible envelope can also be provided partially or completely by the textile 200 (depending on the type of textile coated or not).

The flexible envelope completely or partially encompasses the electronic circuit, the at least one first mechanical and electrical connection means, and the textile substrate. The at least one first mechanical and electrical connection means is at least partially accessible through the flexible envelope so as to be able to connect to the textile. In one embodiment of the invention illustrated in FIG. 1, the at least one first mechanical and electrical connection means 120 is at least partially accessible through the flexible envelope 110 projecting from the flexible envelope 110. In an alternative embodiment not shown, the flexible envelope contains an orifice opening on the at least one first mechanical and electrical connection means so that said at least one first mechanical and electrical connection means is at least partially accessible through the flexible envelope.

The flexible envelope provides control of the flexibility of the device, allowing installation on textile or clothing while protecting, by its local rigidity, the integrity of the electronic circuit. In the embodiment where electronic components are soldered to the electronic circuit, the flexible envelope protects the solder integrity of the electronic components. The flexible envelope provides electrical isolation of the internal signals of the device that could be in contact during the bending of the device, for example during the handling of the user. Flexible envelope is liquid and pollution proof (dust, contaminants, . . . ). This seal thus makes it possible to prevent the degradation of the device, in particular during the washing of the textile or the transpiration of the user.

In one embodiment, the flexible envelope is made of flexible polymer. In one embodiment the flexible envelope is made of elastomer, polyurethane, rubber, or silicone.

In one embodiment, the flexible envelope is a layer of varnish. In this same embodiment, the flexible envelope is formed by a composition comprising at least one organic solvent, a plasticizer and/or a substance capable of forming a plastic film. By drying, this composition forms a layer of varnish (flexible envelope) ensuring the device according to the present invention its flexibility, its sealing to liquids and pollution, its protection and its electrical insulation.

In one embodiment, said device has a flexibility to bend on a cylindrical piece having a radius of 5 to 10 cm without undergoing plastic deformation. This flexibility allows said device to conform to the movements and deformations of the garment on which it is brought to be implanted without damage.

In one embodiment, said device has a thickness less than 10 mm, preferably less than 5 mm, very preferably less than 3 mm.

The invention also relates to a system comprising a textile device according to the present invention, and a textile comprising a conductive zone and at least one mechanical and electrical connection means capable of connecting to the at least one first means of mechanical and electrical connection of said device. in a detachable way. This at least one textile connection means makes it possible to electrically and mechanically connect the device according to the present invention to the conductive zone of the textile.

In one embodiment, the conductive zone of the textile is made by weaving or knitting conductive yarns.

In one embodiment, these conductive wires consist of a conductive material such as silver.

In an alternative embodiment, these conductive yarns consist of textile yarns coated with a conductive material, preferably textile yarns coated with a conductive metal, most preferably textile yarns coated with silver.

In another embodiment, the conductive area of the textile is obtained by printing a conductive ink or by a conductive paint. In this embodiment, the ink or conductive paint is loaded with an electrically conductive material having flexibility properties enabling it to be deposited on flexible surfaces.

In one embodiment, the at least one means of electrical and mechanical connection of the textile is located in the at least one conductive zone of the textile. In one embodiment, the at least one first mechanical and electrical connection means of the flexible electronic device and the at least one textile connection means are complementary. In one embodiment, the at least one first mechanical and electrical connection means of the flexible electronic device and the at least one means for connecting the textile by fitting one in the other in a detachable manner.

In an embodiment illustrated in FIG. 7, the at least one first mechanical and electrical connection means 120 of the flexible electronic device is a male connection means, and the connection means 220 of the textile is a female connection means. In a not shown embodiment, the at least one first mechanical and electrical connection means of the flexible electronic device is a female connection means, and the at least one textile connection means is a male connection means. In a not shown embodiment, the at least one first mechanical and electrical connection means of the flexible electronic device is a series of aligned teeth, and the at least one textile connection means is a second series of aligned teeth, one of the two series comprising a slider for engaging the teeth in each other (i.e. zipper). In an alternative embodiment, the at least one first mechanical and electrical connection means of the textile electronic device and the at least one textile connection means are conductive magnetic connection means or a combination of all the embodiments presented. In the previous embodiments, the at least one first and at least one second mechanical and electrical connection means are simple to use, thus enabling the user to connect and disconnect the textile electronic device 100 to a textile conductive zone 200 without the intervention of a doctor or a technician.

In one embodiment, the textile 200 used is a textile capable of being stretched by at least 15% without undergoing plastic deformation or breakage. In one embodiment, the used textile 200 is capable of being stretched at least 20, 25, 30, 40, 50, 75, 100, 150, 200% without undergoing plastic deformations. This embodiment provides a garment that can be worn in contact with the skin of the user. This contact with the skin of the user makes it possible, for example, to measure bioelectrical data, for example using electrodes integrated into the same textile 200.

Such a device according to the present invention thus solves the technical problem initially presented.

The invention also relates to a method of manufacturing the textile electronic device according to the present invention comprising the following steps:
 depositing at least a second electrical connection means on the textile substrate;
 depositing an electronic circuit on the textile substrate so that at least one track of the electronic circuit is in electrical contact with the second electrical connection means;
 fixing, on the textile substrate, at least a first mechanical and electrical connection means adapted to connect to the conductive zone of a textile; said at least one first mechanical and electrical connection means being in electrical contact with the at least one second electrical connection means; and
 overmolding by a flexible envelope completely or partially including said electronic circuit, said at least one first mechanical and electrical connection means and said textile substrate, said at least one first mechanical and electrical connection means being at least partially accessible through the flexible envelope.

In an alternative embodiment, the overmolding step is replaced by a step of welding at least two surfaces forming a flexible envelope including totally or partially said electronic circuit, said at least a first mechanical and electrical connection means and said substrate textile; said at least one first mechanical and electrical connection means being at least partially accessible through the flexible envelope.

The manufacturing process will be better understood in light of the drawings.

FIG. 1 represents a diagram of the device according to an embodiment of the present invention comprising a flexible envelope 110, a textile substrate 130, at least a first mechanical and electrical connection means 120, and an electronic circuit 140. The textile substrate comprises at least one second electrical connection means 131 connecting the electronic circuit 140 to the at least one first mechanical and electrical connection means 120.

During the first step of deposition of at least a second electrical connection means on the textile substrate, the at least one second electrical connection means is a conductive wire sewn on the textile substrate or a conductive ink printed, screen-printed or deposited by any other method on the textile substrate.

In a first embodiment for the manufacture of the device, a solder material 150 is then deposited on at least a second electrical connection means 131 as illustrated in FIG. 2.

The electronic circuit 140 is then deposited on the textile substrate 130 so that the solder material 150 is in contact with the at least one second electrical connection means 131 and the electronic circuit 140, as illustrated in FIG. 3.

Figure 4:
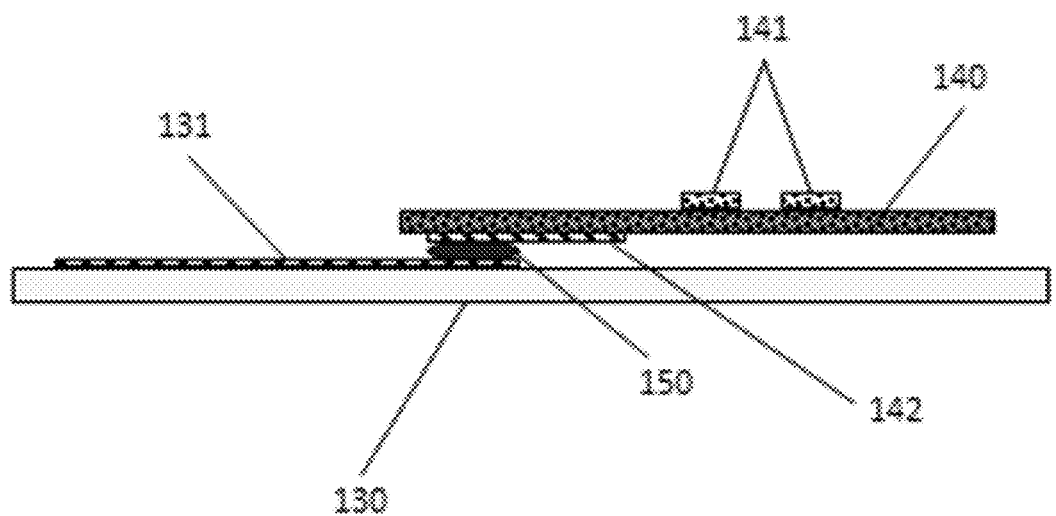

In an embodiment illustrated in FIG. 4, the electronic circuit comprises connection tracks 142. In order to ensure a subsequent electrical connection, the electronic circuit 140 is deposited on the textile substrate 130 so that the solder material 150 is in contact with the at least one second electrical connection means 131 and the connection track of the electronic circuit 142.

Figure 5:
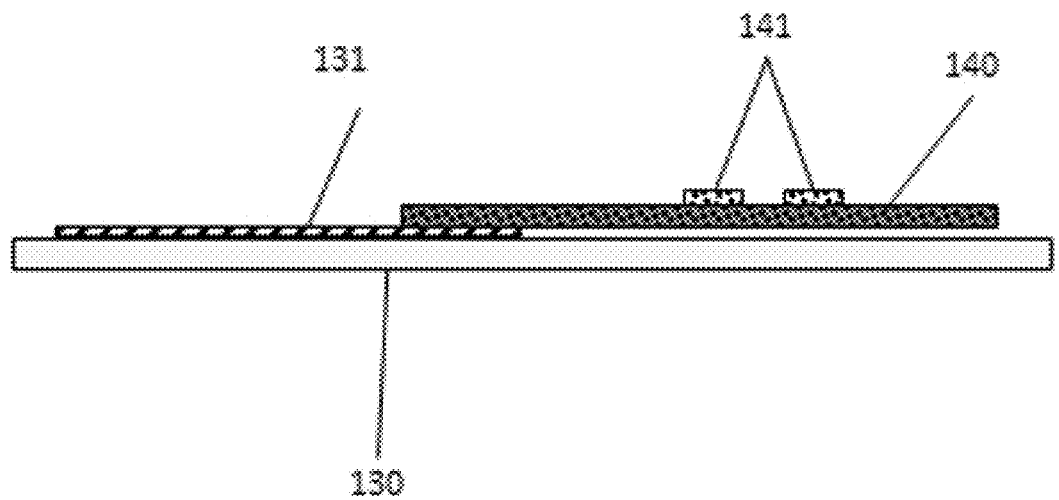

In the next step, the solder material 150 is heated to a temperature above its melting temperature. The material thus melted, will allow to create a continuity of the material and a large contact area between the at least one second electrical connection means 131 and the electronic circuit 140. Once cooled, the at least one second electrical connection means 131 is in electrical contact with the electronic circuit 140. This step is shown in FIG. 5. In this figure, the solder material, which is now negligible in thickness relative to that of the electronic circuit or the textile substrate, is no longer shown. In one embodiment, the welding is performed by the local heating of the welding material. In an alternative embodiment, the solder material is a solder paste or a solder paste and the heating is carried out by heating at least the textile substrate 130 and the electronic circuit 140 connected by the solder material, in an oven, for example, a reflow oven designed for remelting solder paste.

In a second alternative embodiment, the connection between the electronic circuit 140 and the second electrical connection means 131 can be done mechanically, for example by crimping, which makes it possible to dispense with the use of a welding material 150.

Figure 6:
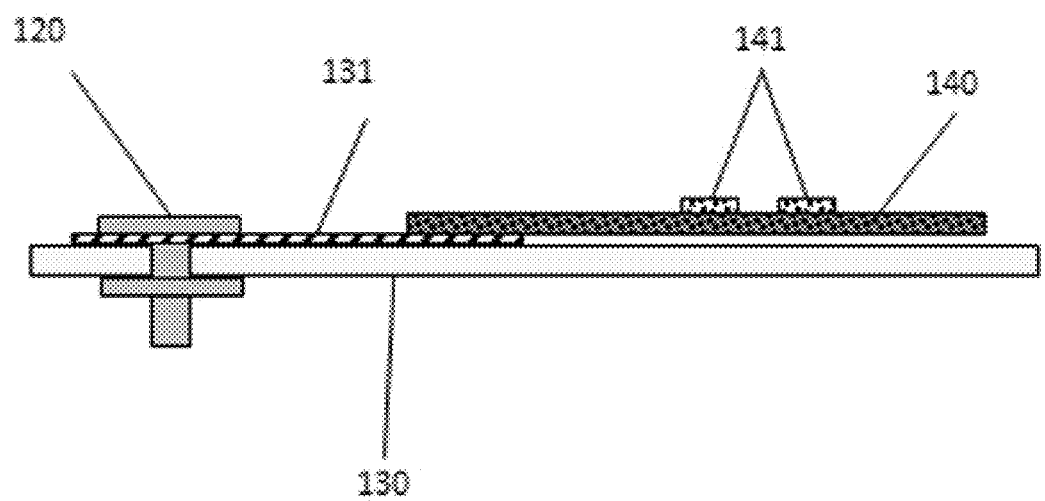
Figure 8:
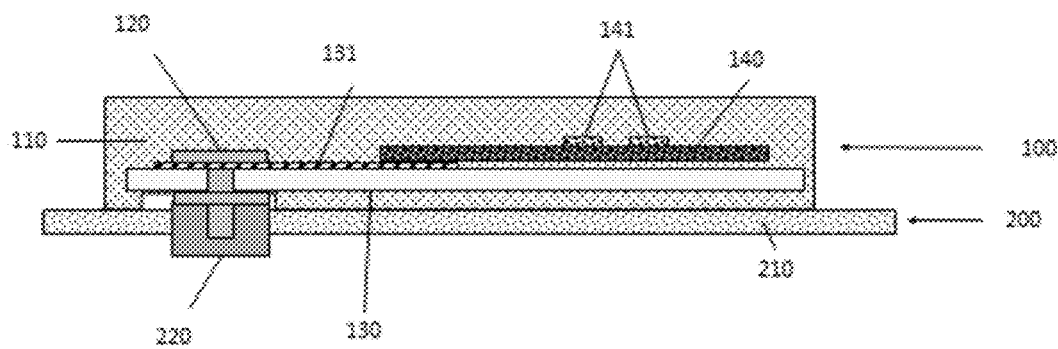
FIG. 8 is a sectional view of the system according to an embodiment of the present invention comprising a textile electronic device 100 connected to a textile 200 by the mechanical and electrical connection means 120, 220.

The at least one first mechanical and electrical connection means 120 is fixed on the flexible substrate 130, as shown in FIG. 6. Said at least one first mechanical and electrical connection means 120 is connected to at least one second electrical connection means 131. As described above, the at least one first mechanical and electrical connection means 120 is able to connect to the conductive zone of a textile. In one embodiment, as shown in FIG. 8, the at least one first mechanical and electrical connection means 120 is adapted to connect to at least one connection means 220 analogous or complementary to the textile.

The device is finally overmolded by a flexible envelope 110. As represented in FIG. 7, the flexible envelope completely or partially encompasses said electronic circuit 140, said at least one first mechanical and electrical connection means 120 and said textile substrate 130, said at least one a first mechanical and electrical connection means 120 being at least partially accessible through the flexible envelope 110. In one embodiment, the device is placed inside a mold into which the flexible overmolding material is injected. In another embodiment, the flexible overmolding material is deposited by spraying or by liquid deposition on the device.

In an alternative embodiment, the overmolding step is replaced by a step of welding at least two surfaces forming a flexible envelope 110 totally or partially including said electronic circuit 140, said at least one first mechanical and electrical connection means. 120 and said textile substrate 130, said at least one first mechanical and electrical connection means 120 being at least partially accessible through the flexible envelope 110.

In one embodiment, the textile substrate previously comprises a portion of the flexible envelope on at least one of its surfaces.

In one embodiment of the invention, the device comprises a plurality of first electrical and mechanical connection means 120. In one embodiment, the textile substrate 130 comprises a plurality of second electrical connection means 131, each connected to the circuit 140, in particular to a connection track 142 and a first means of electrical and mechanical connection. In one embodiment, the device comprises a plurality of first mechanical and electrical connection means 120, each connected to a plurality of electronic circuits 140 by a plurality of second electrical connection means 131.

While various embodiments have been described and illustrated, the detailed description is not to be construed as being limited hereto. Various modifications can be made to the embodiments by those skilled in the art without departing from the true spirit and scope of the disclosure as defined by the claims.

The invention claimed is:

1. A textile electronic device configured to be connected to a conductive zone of a textile, said device comprising:
    an electronic circuit including electrical components being configured to record, analyze, respond to or transmit a signal from the textile;
    at least a first mechanical and electrical connection means configured to be connected to the conductive zone of a textile;
    a textile substrate being at least partially elastic comprising at least a second electrical connection means, said at least one second electrical connection means being electrically connected to the electronic circuit and to the at least one first mechanical and electrical connection means by a welding material or glue; and
    a flexible envelope totally or partially including said electronic circuit, said at least one first mechanical and electrical connection means and said textile substrate, said at least one first mechanical and electrical connection means being at least partially accessible through the flexible envelope, the flexible envelope giving the entire textile electronic device a protective structure for the electronic circuit and the electrical components.

2. The textile electronic device according to claim 1, wherein the flexible envelope is made of polymer and the textile substrate is flexible.

3. The textile electronic device according to claim 2, wherein the polymer of the flexible envelope is an elastomer, a polyurethane, a rubber or a silicone.

4. The textile electronic device according to claim 1, wherein the at least one second electrical connection means of the textile substrate comprises conductive yarns, said conductive yarns consist of a conductive material or textile yarns coated with a conductive material.

5. The textile electronic device according to claim 4, wherein the conductive yarns of the at least one second electrical connection means of the textile substrate are yarns covered with a conductive metal or comprise a conductive ink or a conductive paint.

6. The textile electronic device according to claim 1, wherein the at least one first mechanical and electrical connection means configured to be connected to the conductive zone of a textile is a male snap button and/or a female snap button.

7. A system comprising a textile electronic device according to claim 1, and a textile comprising a conductive area and at least one means of connection configured to be detachably connected electrically and mechanically to the at least one first mechanical and electrical connection means of the device.

8. The textile electronic device according to claim 1, wherein the electronic circuit is flexible.

9. The textile electronic device according to claim 1, wherein the device has a thickness less than 10 mm, and a flexibility allowing the device to bend on a cylindrical piece having a radius of 5 to 10 cm without undergoing plastic deformation.

10. The textile electronic device according to claim 1, wherein the at least one first mechanical and electrical connection means configured to be connected to the conductive zone of a textile is an element of a device of teeth engaged with a slider.

11. The textile electronic device according to claim 1, wherein the at least one first mechanical and electrical connection means configured to be connected to the conductive zone of a textile is a conductive magnetic connection means.

12. The textile electronic device according to claim 1, wherein the at least one first mechanical and electrical connection means configured to be connected to the conductive zone of a textile is a rivet.

13. The textile electronic device according to claim 1, wherein the device comprises at least one reinforcing piece between the electronic circuit and the textile substrate.

14. A method of manufacturing a textile electronic device adapted to be connected to at least one conductive zone of a textile; said method comprising the following steps:
    depositing at least a second electrical connection means on a textile substrate;
    depositing an electronic circuit, comprising a printed circuit on a substrate with at least one track, on the textile substrate so that the at least one track of the electronic circuit is in electrical contact with the second electrical connection means, wherein the substrate comprises plastic, the textile substrate being at least partially elastic, and the electronic circuit including electrical components configured to record, analyze, respond to or transmit a signal from the textile;
    fixing, on the textile substrate, at least a first mechanical and electrical connection means adapted to connect to the conductive zone of a textile; said at least one first mechanical and electrical connection means being in electrical contact with the at least one second electrical connection means by a welding material or glue; and
    overmolding by a flexible envelope or the welding of two surfaces forming a flexible envelope, said flexible envelope totally or partially including said electronic circuit, said at least one first mechanical and electrical connection means and said textile substrate, said at least one first mechanical and electrical connection means being at least partially accessible through the flexible envelope.

15. The method according to claim 14, wherein the step of the manufacturing method of depositing an electronic circuit on the textile substrate such that at least one track of the electronic circuit is in electrical contact with the second connecting means electric comprises:
    depositing on the at least one second electrical connection means of the textile substrate with a solder material;
    depositing an electronic circuit on the textile substrate so that said solder material is in contact with the at least one second electrical connection means and the electronic circuit;

heating said solder material to a temperature greater than the melting temperature of said solder material; and cooling said solder material so as to electrically connect the at least one second electrical connection means of the textile substrate to the electronic circuit.

16. A system comprising a textile electronic device obtained according the manufacturing method of claim 14, and a textile comprising a conductive area and at least one means of connection configured to be detachably connected electrically and mechanically to the at least one first mechanical and electrical connection means of the device.

\* \* \* \* \*